United States Patent
Puthana et al.

(10) Patent No.: US 9,864,828 B1
(45) Date of Patent: Jan. 9, 2018

(54) HARDWARE ACCELERATION DEVICE HANDOFF FOR USING PROGRAMMABLE INTEGRATED CIRCUITS AS HARDWARE ACCELERATORS

(71) Applicant: Xilinx, Inc., San Jose, CA (US)

(72) Inventors: Susheel Kumar Puthana, Longmont, CO (US); Stephen P. Rozum, Loveland, CO (US); Sudipto Chakraborty, Longmont, CO (US); David A. Knol, Morgan Hill, CA (US); Yong Li, Fremont, CA (US); Fernando J. Martinez Vallina, Sunnyvale, CA (US); Sonal Santan, San Jose, CA (US); Nabeel Shirazi, Saratoga, CA (US); Salil R. Raje, Saratoga, CA (US); Ethan T. Parker, Tualatin, OR (US); Suman Kumar Timmireddy, Nellore (IN); Heera Nand, Alwar (IN)

(73) Assignee: XILINX, INC., San Jose, CA (US)

( * ) Notice: Subject to any disclaimer, the term of this patent is extended or adjusted under 35 U.S.C. 154(b) by 148 days.

(21) Appl. No.: 14/857,634

(22) Filed: Sep. 17, 2015

(51) Int. Cl.
  *G06F 17/50* (2006.01)
(52) U.S. Cl.
  CPC ...... *G06F 17/5077* (2013.01); *G06F 17/5072* (2013.01)

(58) Field of Classification Search
  CPC .................. G06F 17/5077; G06F 17/5072
  See application file for complete search history.

(56) References Cited

U.S. PATENT DOCUMENTS

| | | | | |
|---|---|---|---|---|
| 2007/0006045 | A1* | 1/2007 | Mooney | G06F 9/4881 714/38.14 |
| 2013/0212366 | A1* | 8/2013 | Chen | G06F 17/5054 713/1 |
| 2014/0189622 | A1* | 7/2014 | Titley | G06F 17/5054 716/105 |
| 2016/0180001 | A1* | 6/2016 | Adler | G06F 17/5045 716/138 |

* cited by examiner

Primary Examiner — Vuthe Siek
(74) Attorney, Agent, or Firm — Kevin T. Cuenot

(57) ABSTRACT

Implementing hardware accelerators using programmable integrated circuits may include performing, using a processor, a design flow on a static circuit design. The static circuit design may specify a region reserved for a hardware accelerator and a static region comprising interface circuitry configured to couple the hardware accelerator with an external node. The design flow may generate an implemented static circuit design. Metadata describing the interface circuitry may be generated using a processor. A device support archive including the implemented static circuit design and the metadata may be written, using the processor, to a computer readable storage medium.

20 Claims, 5 Drawing Sheets

HARDWARE ACCELERATION DEVICE HANDOFF FOR USING PROGRAMMABLE INTEGRATED CIRCUITS AS HARDWARE ACCELERATORS

TECHNICAL FIELD

This disclosure relates to hardware acceleration and, more particularly, to hardware acceleration device handoff for using programmable integrated circuits as hardware accelerators.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable tiles. These programmable tiles may include, but are not limited to, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry may include a large number of interconnect lines of varying lengths interconnected by programmable interconnect points (PIPs). The programmable logic circuitry implements the logic of a user circuit design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits may be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs may also be implemented in other ways, e.g., using fuse or antifuse technology. The phrase "programmable IC" may include, but is not limited to, these devices and further may encompass devices that are only partially programmable. For example, one type of programmable IC includes a combination of hard-coded transistor logic and a programmable switch fabric that programmably interconnects the hard-coded transistor logic.

In some systems, programmable ICs may be used to implement hardware accelerators. A hardware accelerator is a circuit implementation of computer readable program instructions (e.g., program code). Rather than execute program code on a processor to perform one or more tasks, the tasks may be performed by a hardware implementation, e.g., circuitry, of the program code referred to as a hardware accelerator. The hardware accelerator may be considered a hardware implementation of the program code that is functionally equivalent to the program code being hardware accelerated. The hardware accelerator is often able to perform tasks faster and using less power than a processor performing the same tasks by executing program code.

SUMMARY

A method includes performing, using a processor, a design flow on a static circuit design specifying a region reserved for a hardware accelerator and a static region comprising interface circuitry configured to couple the hardware accelerator with an external node. The design flow may generate an implemented static circuit design. The method may include generating, using the processor, metadata describing the interface circuitry and writing, using the processor, a device support archive to a computer readable storage medium. The device support archive may include the implemented static circuit design and the metadata.

A method may include reading, using a processor, metadata from a device support archive including an implemented static circuit design. The metadata may describe interface circuitry of the implemented static circuit design. The method may include generating, using the processor, a register transfer level kernel implementation from a high level programming language kernel implementation and combining, using the processor, the circuit design of the static region with the register transfer level kernel implementation using the metadata. The method may also include generating, using the processor, a configuration bitstream comprising a hardware implementation of the kernel.

A system may include a processor programmed to initiate methods and/or processes comprising executable operations as described herein.

A non-transitory computer-readable medium may have instructions stored thereon which, when executed by a processor, perform the methods and/or processes described herein.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
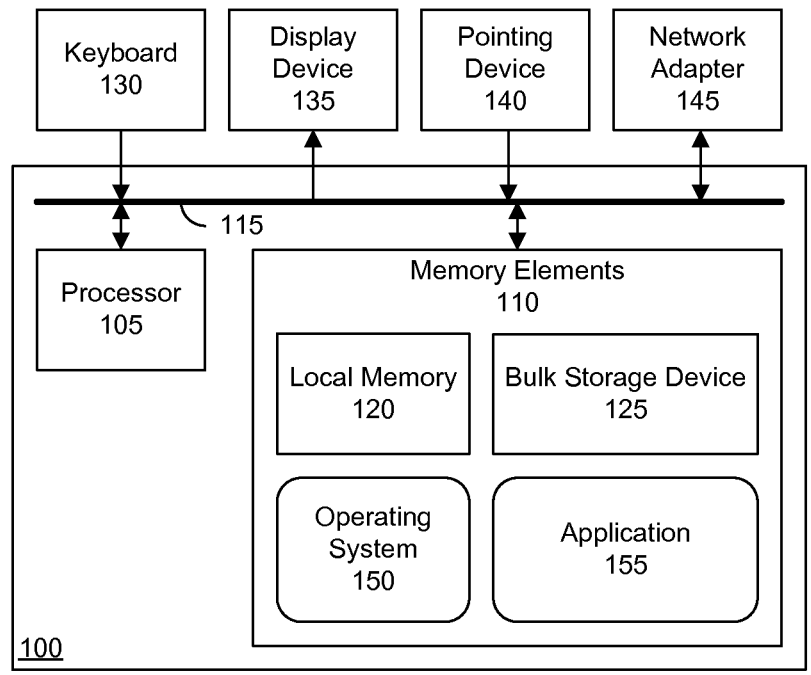
FIG. 1 is a block diagram illustrating an exemplary data processing system.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to hardware acceleration and, more particularly, to hardware acceleration device handoff for using programmable integrated circuits (ICs) as hardware accelerators. In accordance with the inventive arrangements described within this disclosure, components needed to implement hardware accelerators using a programmable IC may be provided as part of a handoff process. The components may then be utilized to hardware accelerate program code for implementation as circuitry within the programmable IC.

As an illustrative example, a programmable IC may be coupled to a circuit board. The programmable IC, the circuit board, and any other circuitry implemented on the circuit board may be collectively referred to herein as a hardware accelerator device. The hardware accelerator device may be coupled to a host processor, e.g., included in a data processing system, as part of a heterogeneous computing platform.

The hardware accelerator device manufacturer, vendor, and/or other party may provide the hardware accelerator device to users. In providing the hardware accelerator device to users as part of a handoff process, supporting components may also be provided. In one aspect, the supporting components may be provided as a single file thereby simplifying hardware accelerator development. The components may include, but are not limited to, a static circuit design. The static circuit design may provide interface circuitry necessary for a user circuit design (i.e., the hardware accelerator) to communicate with one or more nodes and/or systems external to the programmable IC. Exemplary nodes and/or systems external to the programmable IC may include circuitry implemented on the circuit board and/or the host processor.

With the supporting components, a user may create a circuit design implementation of program code referred to as a hardware accelerator. The hardware accelerator may be initially specified in a high level programming language. The hardware accelerator may be implemented in the programmable IC and operate cooperatively with the static circuit design also implemented within the programmable IC. Since the static circuit design handles various input and/or output operations for the programmable IC and the user may design the hardware accelerator using a high level programming language as opposed to a hardware description language, the user is relieved from having to understand hardware communication interfaces and other hardware intricacies relating to circuit design. For example, the user may design a hardware accelerator to perform only particular operations without having to implement I/O circuitry, network adapters, or the like that move data into and out from the programmable IC.

The inventive arrangements described herein may be implemented as a method or process performed by a data processing system. In one example, a simplified handoff process is described to implement hardware accelerators using programmable ICs. In another aspect, the inventive arrangements may be implemented as a data processing system having a processor. The processor, upon executing program code, may perform executable operations described herein for performing a simplified handoff process to implement hardware accelerators using programmable ICs. In still another aspect, the inventive arrangements may be implemented as a non-transitory computer-readable storage medium storing program code that, when executed, causes a processor and/or a system to perform and/or initiate a method or process as described within this disclosure.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a block diagram illustrating an exemplary data processing system (system) 100. As pictured, system 100 includes at least one processor, e.g., a central processing unit (CPU), 105 coupled to memory elements 110 through a system bus 115 or other suitable circuitry. System 100 stores computer readable program instructions (also referred to as "program code") within memory elements 110. Memory elements 110 may be considered an example of computer readable storage media. Processor 105 executes the program code accessed from memory elements 110 via system bus 115.

Memory elements 110 may include one or more physical memory devices such as, for example, a local memory 120 and one or more bulk storage devices 125. Local memory 120 refers to random access memory (RAM) or other non-persistent memory device(s) generally used during actual execution of the program code. Bulk storage device 125 may be implemented as a hard disk drive (HDD), solid state drive (SSD), or other persistent data storage device. System 100 may also include one or more cache memories (not shown) that provide temporary storage of at least some program code in order to reduce the number of times program code must be retrieved from bulk storage device 125 during execution.

Input/output (I/O) devices such as a keyboard 130, a display device 135, a pointing device 140, and one or more network adapters 145 may be coupled to system 100. The I/O devices may be coupled to system 100 either directly or through intervening I/O controllers. In some cases, one or more of the I/O devices may be combined as in the case where a touchscreen is used as display device 135. In that case, display device 135 may also implement keyboard 130 and pointing device 140. Network adapter 145 may be used to couple system 100 to other systems, computer systems, remote printers, and/or remote storage devices through intervening private or public networks. Modems, cable modems, Ethernet cards, and wireless transceivers and/or radios are examples of different types of network adapter 145 that may be used with system 100. Depending upon the particular implementation of system 100, the specific type of network adapter, or network adapters as the case may be, will vary.

As pictured in FIG. 1, memory elements 110 may store an operating system 150 and one or more applications 155. In one aspect, application 155 may be an electronic design automation (EDA) application. Operating system 150 and application 155, being implemented in the form of executable program code, may be executed by system 100 and, in particular, by processor 105. As such, operating system 150 and application 155 may be considered an integrated part of system 100. Operating system 150, application 155, and any data items used, generated, and/or operated upon by system 100 are functional data structures that impart functionality when utilized by system 100.

In one aspect, system 100 may be a computer or other device that is suitable for storing and/or executing program code. System 100 may represent any of a variety of computer systems and/or devices that include a processor and memory and that are capable of performing the operations described within this disclosure. In some cases, the particular computer system and/or device may include fewer components or more components than described. System 100 may be implemented as a single system as shown or as a plurality of networked or interconnected systems each having an architecture the same as, or similar to, that of system 100.

System 100 may be configured to generate a device support archive (DSA) file. In one aspect, the DSA is a single file. In one exemplary implementation, the DSA may be implemented as a package file. The DSA may include a plurality of different components. For example, the DSA may include a static circuit design. The DSA may also include metadata specifying descriptions of interface circuitry included in the static circuit design. The DSA may also include one or more other components to be described herein in greater detail.

In one example, a manufacturer or vendor of a circuit board including a programmable IC may create a DSA that may be provided on a computer readable storage medium with a hardware acceleration device to customers or users. The DSA includes the information necessary for the user to create one or more hardware accelerators as will be described herein in greater detail without needing to know the particular architecture of the programmable IC or other parts of the hardware acceleration device. The user may create hardware accelerators that perform particular operations without, for example, having to also create supporting circuitry within the programmable IC that acquires data from outside the programmable IC and/or sends the results of operations outside the programmable IC.

Figure 2:
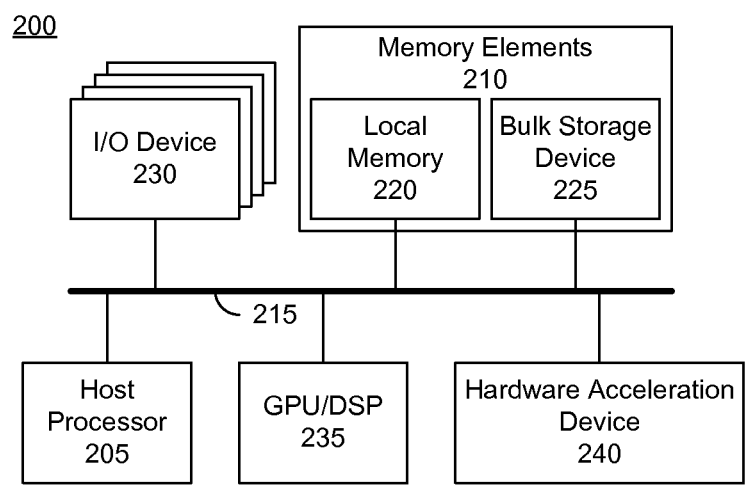
FIG. 2 is an exemplary architecture for a heterogeneous computing platform.

FIG. 2 is an exemplary architecture 200 for a heterogeneous computing platform. Architecture 200 may include a hardware acceleration device 240. A heterogeneous computing platform refers to a data processing system that uses two or more computing platforms where at least one computing platform utilizes an instruction set that is different from at least one other computing platform. Exemplary heterogeneous computing platforms may include a CPU and a graphics processing unit (GPU); a CPU and digital signal processor (DSP); a CPU, a GPU, and a DSP; or the like. Other examples of heterogeneous computing platforms may include one or more of a CPU, a GPU, a DSP, or other processor that is configured to execute program code in combination with one or more hardware accelerators.

Architecture 200 may be implemented using one or more elements that are similar to, or the same as, those described with reference to FIG. 1. For ease of illustration, similar or same elements are not described in significant detail. As pictured, architecture 200 may include a host processor 205 (host). Host 205 may be implemented as a CPU. Host 205 may be coupled to memory elements 210 through a system bus 215 or other suitable circuitry. Architecture 200 stores program code within memory elements 210. Program code stored in memory elements 210 may include host program code and/or program code that implements kernels.

Memory elements 210 may include one or more physical memory devices such as, for example, a local memory 220 and one or more bulk storage devices 225. Architecture 200 may be coupled to one or more I/O devices 230. Exemplary I/O devices may include, but are not limited to, a keyboard, a display device, a pointing device, and/or one or more network adapters. For ease of illustration, an operating system and applications are not illustrated. It should be appreciated that architecture 200 may execute an operating system in combination with one or more applications implemented in the form of executable program code.

In the example of FIG. 2, architecture 200 may optionally include a second platform such as one or more of a GPU and/or a DSP illustrated as GPU/DSP 235. Architecture 200, as noted, further includes hardware acceleration device 240. Hardware acceleration device 240 may include a programmable IC that may communicate with other elements of architecture 200 through system bus 215 or other circuitry.

Architecture 200 may be used to implement a data processing system that is configured for hardware acceleration. A heterogeneous design may be executed by a system using architecture 200. An example of a heterogeneous design is an OpenCL design. OpenCL stands for "Open Computing Language" and is a framework for writing computer programs that may execute across heterogeneous computing platforms. When compiled, an OpenCL design may include executable program code that is executed by a host 205. The OpenCL design may also include executable program code that may be referred to as a kernel. The OpenCL design may include one or more kernels that may be offloaded from host 205 to one or more of the other processors, e.g., GPU/DSP 235, for execution, thereby increasing overall execution speed and efficiency.

The OpenCL design further may include one or more kernels that may be hardware accelerated and implemented as circuitry within the programmable IC of hardware acceleration device 240. Kernels implemented as circuitry are said to be "hardware accelerated" and may be referred to as "hardware accelerators." The circuitry of the programmable IC may implement a kernel that operates faster and with greater efficiency than had the kernel been executed as program code by GPU/DSP 235.

Figure 3:
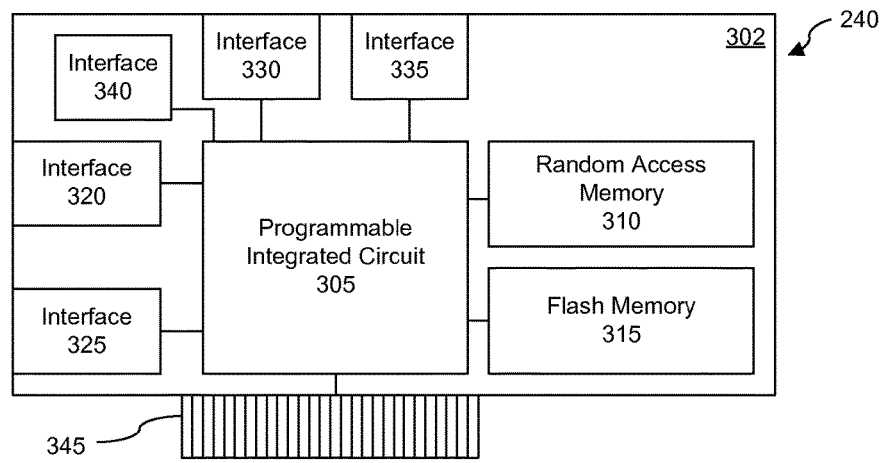
FIG. 3 is a block diagram illustrating an exemplary hardware acceleration device.

FIG. 3 is a block diagram illustrating an exemplary implementation of hardware acceleration device 240. Hardware acceleration device 240 may be implemented as a circuit board 302 including a plurality of components. As pictured, hardware acceleration device 240 may include a programmable IC 305, RAM 310, flash memory 315, and one or more interfaces pictured as interface 320, 325, 330, 335, and 340.

Programmable IC 305 may be implemented as an FPGA. RAM 310 may be implemented as one or more RAM circuit modules coupled to programmable IC 305. Flash memory 315 may be implemented as one or more flash memory circuit modules coupled to programmable IC 305. Each of interfaces 320, 325, 330, 335, and 340 may be coupled to programmable IC 305.

In one aspect, interfaces 320 and 325 each may be implemented as a 10 gigabit Ethernet connector that allows hardware acceleration device 240 to couple to one or more other systems. Interfaces 330 and 335 may be implemented as Serial Advanced Technology Attachment (SATA) connectors that allow hardware acceleration device 240 to couple to one or more other systems. Interface 340 may be implemented as a Joint Test Action Group (JTAG) connector.

In the example of FIG. 3, hardware acceleration device 240 may be implemented with a form factor of a card that may plug, or be inserted, into a Peripheral Component Interconnect (PCI) Express serial bus card slot. As such, hardware acceleration device 240 may include a card edge connector 345. For example, programmable IC 305 may communicate with host 205 and/or another processor (e.g., GPU/DSP 235) through communication bus 215 by way of card edge connector 345.

Figure 4:
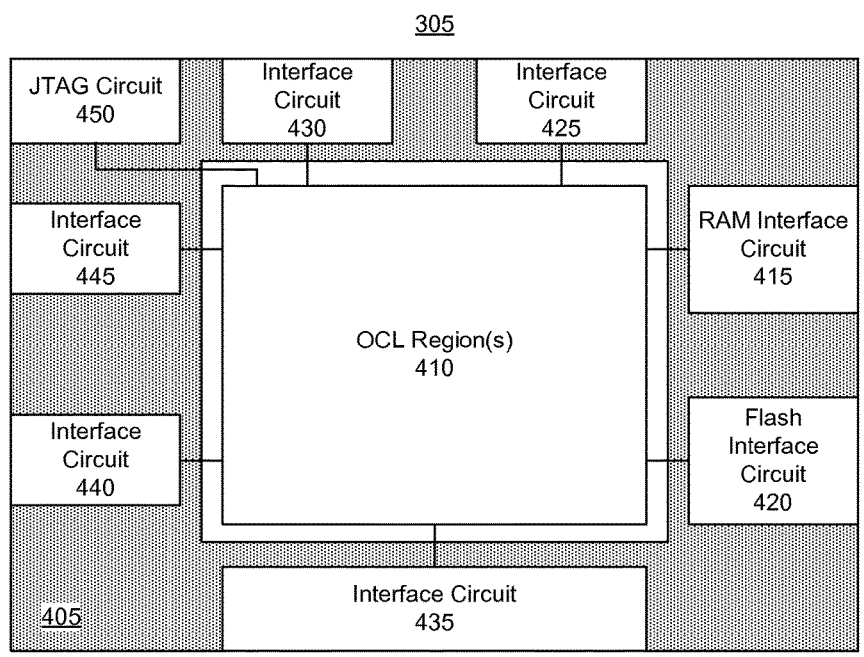
FIG. 4 is a block diagram illustrating an exemplary programmable integrated circuit (IC).

FIG. 4 is a block diagram illustrating an exemplary implementation of programmable IC 305. Programmable IC 305 may include a static region 405 and one or more Open CL (OCL) regions 410. Static region 405 is indicated with shading. The various circuit blocks within the shaded portion of programmable IC 305 are part of static region 405. For example, static region 405 may include a RAM interface circuit 415 (e.g., a RAM memory controller), a flash interface circuit 420 (e.g., a flash memory controller), and interface circuits 425, 430, 435, 440, and 445. Static region 405 also may include a JTAG circuit 450. OCL regions 410 are not part of, or included within, static region 405.

For purposes of illustration, and with reference to FIG. 3, interface circuits 425 and 430 may be SATA interface circuits. Interface circuits 440 and 445 may be 10 gigabit Ethernet interface circuits. Interface circuit 435 may be a PCIe interface circuit. JTAG circuit 450 may be a JTAG interface circuit or port.

Static region 405 may be implemented by loading a static circuit design within the configuration memory of programmable IC 305. The static circuit design that implements static region 405 may be included in a DSA among other components. OCL region(s) 410 represent the area in which hardware accelerators may be implemented. In one aspect, static region 405, and as such, the static circuit design specifying static region 405, may be implemented as a static region in terms of performing partial reconfiguration.

OCL region(s) 410 may be implemented as a dynamically reconfigurable region. As such, one or more partial configuration bitstreams may be loaded into programmable IC 305 to implement one or more hardware accelerators in OCL region(s) 410. Subsequently, one or more other, different partial configuration bitstreams may be loaded into programmable IC 305 to implement one or more other hardware accelerators, other combination of hardware accelerator(s), and/or one or more different versions of hardware accelerators in OCL region(s) 410. In one aspect, different OCL regions 410 may be needed to optimize location and utilization of resources on programmable IC 305 or to implement different kernels that may use different interfaces to communicate with static region 405.

It should be appreciated that while one or more different partial configuration bitstreams may be loaded into programmable IC 305 to implement one or more different hardware accelerators in OCL regions 410, static region 405 within programmable IC 305 may remain operational. For example, only the OCL regions 410 need be dynamically reconfigured. This allows static region 405 to maintain connectivity with circuit board 302 of hardware acceleration device 240 and/or with host processor 205 while different hardware accelerators are implemented in OCL regions 410.

Figure 5:
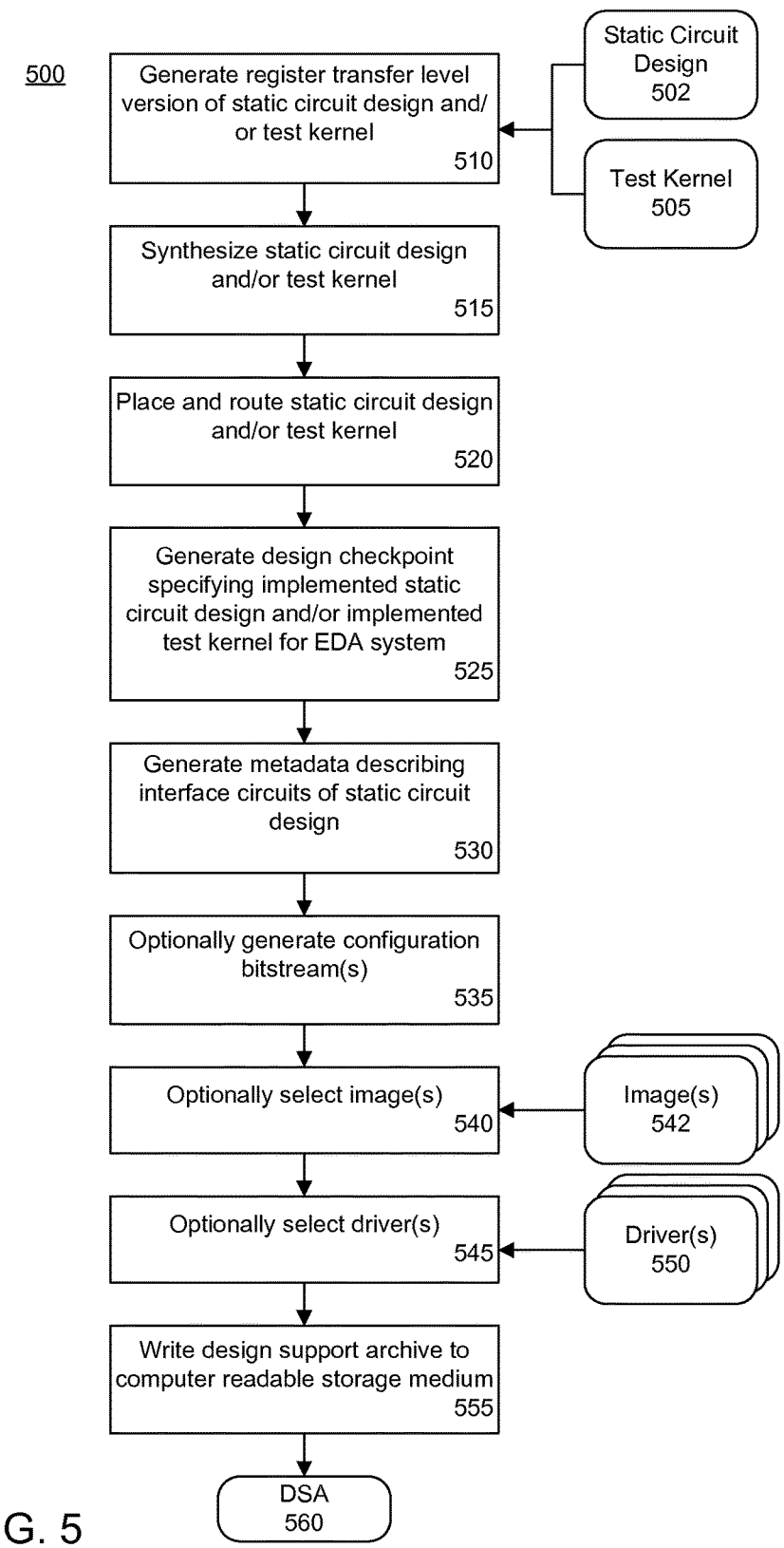
FIG. 5 is a flow chart illustrating an exemplary method of creating a device support archive file.

FIG. 5 is a flow chart illustrating a method 500 of creating a DSA. Method 500 may be performed by a system such as system 100 of FIG. 1. FIG. 5 may begin in a state where static circuit design 502 is provided. In another aspect, a test kernel 505 may optionally be provided.

In one aspect, static circuit design 502 may be specified as a schematic such as a high level block diagram. Static circuit design 502 may be specified, for example, graphically as a plurality of interconnected blocks or other visual objects. Each block of static circuit design 502 may be visualized using a display of a system configured for performing EDA operations. Each block of static circuit design 502 may represent a circuit block. For example, blocks may represent Intellectual Property (IP) blocks or "cores." The blocks may be coupled by lines representing wires or signals. The lines specify connectivity among the various blocks.

In another aspect, static circuit design 502 may be specified using a hardware description language, using a high level programming language, or the like. The examples disclosed herein for the initial form of static circuit design 502 are for purposes of illustration are not intended as limitations. In any case, static circuit design 502, after undergoing a design flow, may be loaded into a programmable IC to implement a static region therein similar to the static region described with reference to FIG. 4. As defined within this specification, the term "design flow" refers to synthesis, placement, and routing.

Static circuit design 502 may include a placeholder for one or more OCL region(s). The OCL region(s) may be added or otherwise specified at a later time. In this manner, a hardware accelerator device provider may create a static circuit design that leaves space on a programmable IC into which user designs to be hardware accelerated may be inserted. In one example, an OCL region may be specified as a hierarchical IP (HIP) block within static circuit design 502. The HIP block is a programmatic structure that may include one or more other circuit blocks or IP blocks (e.g., cores) organized hierarchically within the HIP block. At least initially, the HIP block may be empty. It should be appreciated, however, that other data structures may be used to represent the OCL region(s) or as placeholders for OCL region(s). The use of HIP blocks in this disclosure is for purposes of illustration only.

Test kernel 505 may be a circuit design that provides basic functionality for testing purposes. Test kernel 505 may be specified in any of a variety of formats. In one aspect, test kernel 505 may be specified as a schematic as described with reference to static circuit design 502. In that case, test kernel 505 may undergo circuit implementation the same as or similar to that of static circuit design 502. It should be appreciated, however, that test kernel 505 may be specified in a hardware description language, in a high level programming language, or the like. The examples provided are for purposes of illustration and are not intended as limitations of the inventive arrangements described herein.

Test kernel 505 may optionally be provided so that a user may test the functionality of the hardware acceleration device, the programmable IC, and/or the static circuit design. For example, once implemented, test kernel 505 may be loaded concurrently with the implemented static circuit design into the programmable IC. Test kernel 505 may be specified as a partial configuration bitstream and may be implemented within the OCL region of the programmable IC. Test kernel 505 may provide basic functions that allow a user to test the operability of the hardware acceleration device. For example, test kernel 505 may be configured to receive a test request through any of the various interfaces described and provide an acknowledgement responsive to the test request over the same interface that the test request was received. This allows the user to ensure that the hardware acceleration device, the programmable IC, and/or the static circuit design are working properly without having to first create and/or implement a user circuit design for implementation within the OCL region.

In block 510, the system may generate a register transfer level (RTL) version of static circuit design 502 and/or test kernel 505. In block 515, the system may synthesize the RTL version of static circuit design 502 and/or test kernel 505.

Synthesis refers to the process of converting, or translating, an abstract, programmatic description of a circuit into a low-level design implementation. The abstract, programmatic description of the circuit describes behavior of the circuit and is also referred to as a "behavioral description" or an "RTL description of the circuit. The behavioral description may be specified using a hardware description language. The low-level design implementation generated through synthesis typically is specified as inter-connected logic gates.

Synthesis may also include mapping. Mapping is the process of correlating, or matching, the logic gates of the low-level circuit design to the various types of circuit blocks or physical circuit resources that are actually available in the particular IC in which the circuit design is to be implemented, i.e., the "target IC." For example, since a lookup table (LUT) may implement a complex function, one or more logic gates of the low-level design implementation may be mapped to a single LUT, or other programmable tile of the target IC. The mapped circuit design specifies the same functionality as the low-level design implementation, albeit in terms of the particular circuit blocks available on the target IC as opposed to low-level logic gates.

In block 520, the system may place and route static circuit design 502 and/or test kernel 505. Placement is the process of assigning elements of the synthesized circuit design to particular instances of circuit blocks and/or resources having specific locations on the target IC. Once placed, a circuit element of the circuit design has a specific location on the target IC as opposed to only being assigned to a particular type of circuit block and/or resource as is the case after mapping and prior to placement. The location of a circuit element of a circuit design, once placed, is the location on the target IC of the instance of the circuit block and/or resource to which the circuit element is assigned. Routing is the process of selecting particular routing resources such as wires, PIPs, PIP settings, and/or other interconnect circuitry to electrically couple the various circuit blocks of the target IC after placement.

In one aspect, a synthesized, placed, and routed circuit design may be referred to as being "implemented." The implemented static circuit design and/or the implemented test kernel may be specified in an internal format referred to as a design checkpoint that may be stored in a memory. The implemented test kernel may be specified as a separate design checkpoint or as part of the design checkpoint for the static circuit design. The design checkpoint may be opened, or re-opened, by a system at a later point in time while retaining the synthesis, placement, and/or routing information from the design flow. For example, subsequent to development by a hardware acceleration device provider, a user of the hardware acceleration device may utilize the design checkpoint.

Configuration bitstreams for programming configuration memory cells of a programmable IC may be generated from the design checkpoint. The design checkpoint may specify resources of the programmable IC used to implement circuit components (e.g., from synthesis and/or mapping), location of circuit elements of the circuit design on the programmable IC (e.g., from placement), connectivity among the resources (e.g., from routing), and the like.

In one arrangement, the design checkpoint is akin to object code in that the design checkpoint for the implemented static circuit design and/or test kernel is no longer in human readable form. Reverse engineering the design checkpoint is difficult, which provides protection for any circuit designs within the design checkpoint. In other hand-off processes, for example, the user is often provided with source files for the static circuit design thereby exposing the intellectual property and/or proprietary circuit design information of the hardware acceleration device provider to the user and/or other unauthorized entities.

In block 530, the system may generate metadata describing interface circuits of the static circuit design. The system may generate metadata describing the type of interface circuits included in the static circuit design (e.g., memory mapped interfaces, streaming interfaces, types of AXI interconnects, packetized, etc.), the location of the interface circuits on the programmable IC, signals of the interface circuits, signal widths of the interface circuits, and other information that may be required to communicatively link, e.g., couple, hardware accelerators to the interface circuits of the static circuit design. In one aspect, the metadata may be specified using eXtensible Markup Language (XML).

In block 535, the system may optionally generate a configuration bitstream for the implemented static circuit design and/or for the implemented test kernel. The configuration bitstreams may be specified in a format that is suitable for storage in a flash memory device. In one aspect, the implemented static circuit design and the implemented test kernel may be specified as a configuration bitstream configured for dynamic partial reconfiguration. In that case, the static circuit design may be specified as a configuration bitstream having a dynamically reconfigurable partition. The implemented test kernel may be specified as a partial configuration bitstream that may be implemented in the dynamically reconfigurable partition within the programmable IC.

In block 540, the system may optionally select or otherwise obtain one or more images 542. Images 542 may be actual images and/or visual representations of the hardware acceleration device or portions thereof that may be rendered or otherwise displayed as part of a graphical user interface of an EDA application to a user. For example, when a user utilizes the DSA, one or more of image 542 may be displayed to illustrate various which elements are being exercised by operations taking place within circuit board 302, circuit blocks of static circuit design, or the like, during development of kernels, testing and/or debugging of kernels, and/or implementation of kernels in the OCL region of the programmable IC.

In block 545, the system may optionally select or otherwise obtain one or more drivers 550. Drivers 550 may be one or more drivers that are executable by the host for accessing and/or communicating with the programmable IC including the static region once loaded into the programmable IC. For example, one or more PCIe drivers that may be executed by the host may be received by the system.

In block 555, the system may write DSA 560 to a computer readable storage medium. In writing DSA 560, the system may include one or more design checkpoints. The system may include the design checkpoint of the implemented static circuit design within DSA 560. The system may include the metadata within DSA 560. The metadata may be specified as an XML file or data. The system may optionally include the design checkpoint of the test kernel within DSA 560. The system may optionally include the configuration bitstream for the static circuit design within DSA 560. The system may optionally include the configuration bitstream (e.g., partial configuration bitstream) for the test kernel within DSA 560. Further, the system may optionally include one or more images 542 within DSA 560. The system may optionally include one or more drivers 550 within DSA 560.

DSA 560 may be implemented as a single file that may include any combination of the aforementioned components. In one aspect, DSA 560 may be implemented as a package file or archive file format. For example, DSA 560 may be implemented as a compressed file such as a zip file or the like that supports lossless compression.

Providing the components needed for creating hardware accelerators in a single file format may significantly simplify the design process. Other handoff techniques attempt to provide one or more components as a large, complex directory structure. The directory structure typically includes many different files and nested folders. As noted, the files typically included source files for the static circuit design, thereby exposing the specific circuit implementation of the static region to users.

In another aspect, DSA 560 may be encrypted. For example, the system may encrypt DSA 560 so that authorized systems and/or users may open or access the contents of DSA 560. In another aspect, one or more of the individual components may be encrypted prior to being written to DSA 560.

As discussed, the OCL region may be designated as a dynamically reconfigurable region of the programmable IC. In this regard, the test kernel may be designated as a circuit design for implementation within that dynamically reconfigurable region. The configuration bitstream specifying the test kernel, for example, may be a partial configuration bitstream that may be loaded into the programmable IC concurrently with the configuration bitstream specifying the static circuit design or subsequent to implementing the static circuit region within the programmable IC.

In one exemplary implementation, DSA 560 may include a design checkpoint for the static region and a configuration bitstream specifying the static region and the test kernel. As noted, the test kernel may be replaced using another partial configuration bitstream. One or more other elements such as drivers, images, metadata, and/or the like may also be included.

Figure 6:
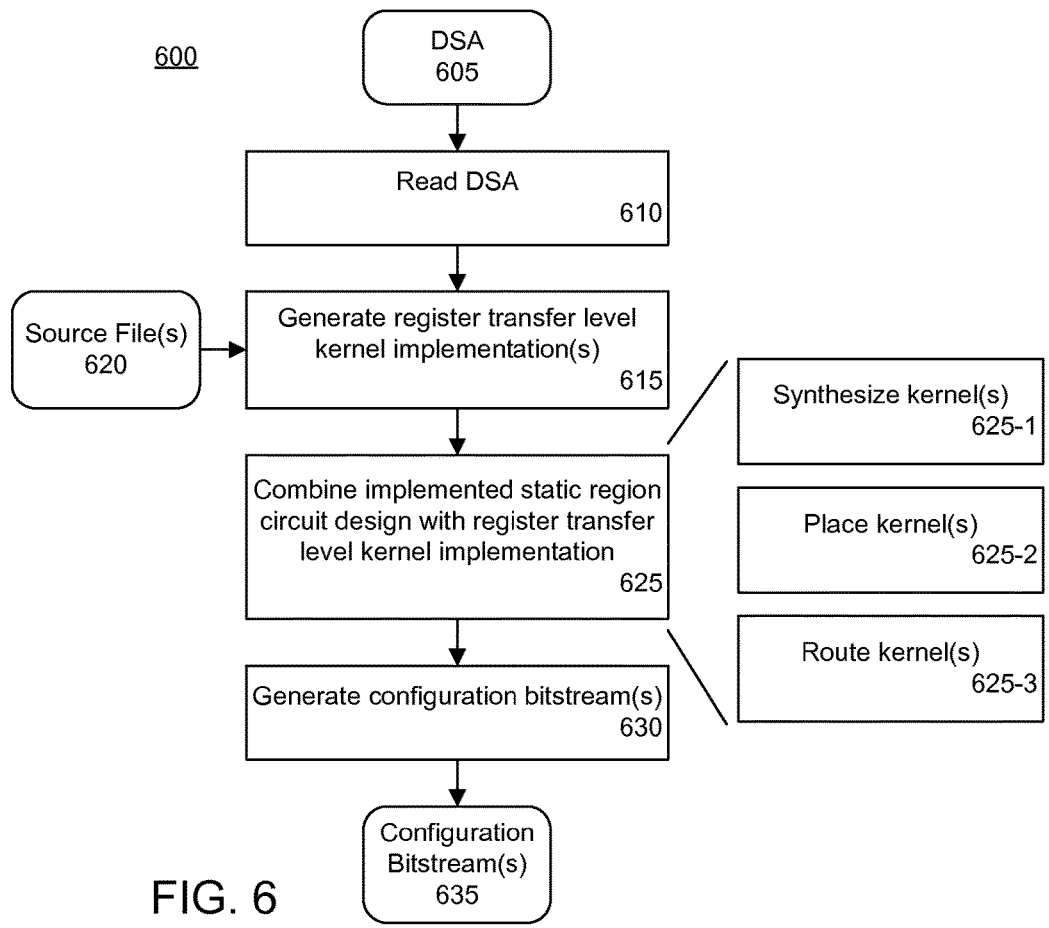
FIG. 6 is a flow chart illustrating an exemplary method of creating a hardware accelerator.

FIG. 6 is a flow chart illustrating an exemplary method 600 of creating a hardware accelerator. Method 600 may be implemented by a system as described with reference to FIG. 1. Method 600 illustrates exemplary operations performed by a user system in creating a hardware accelerator. For example, a user may obtain a DSA 605. DSA 605 may be generated as described with reference to FIG. 5. DSA 605 may accompany a hardware acceleration device acquired by the user. DSA 605 may be provided on a computer readable storage medium such as a CD-ROM, a DVD, downloaded from another data processing system over a network and stored in a memory, etc., and loaded into the user system.

In block 605, the system may read the DSA. For example, the system may read the metadata for the implemented static circuit design. In block 615, the system may generate an RTL kernel implementation from a high level programming language kernel implementation.

For example, the system may receive one or more source files 620. Source file(s) 620 may be specified in a high level programming language. The high level programming language may be in the form of source code. As defined herein, the term "source code" means high level programming language code specified in a human readable form that has not undergone compilation (e.g., conversion to object code and/or conversion to RTL format). Each of source file(s) 620 may specify one or more kernels that are to be hardware accelerated. The kernels may be specified as part of an OpenCL design. In one aspect, the system may generate a file for each source file, where the generated file is specified in RTL, e.g., as an RTL translation of the source file(s) 620.

In block 625, the system may combine the implemented static region circuit design with the RTL kernel implementation(s) of block 615. In one aspect, combining the implemented static region circuit design with the RTL kernel implementation(s) may include a plurality of operations. For example, in block 625-1, the system may synthesize the RTL kernel implementation(s). In block 625-2, the system may place the kernel(s), in block 625-3, the system may route the kernel(s).

It should be appreciated that block 625 may be performed using the metadata read from DSA 605. As discussed, the metadata describes the interface circuitry available in the implemented static circuit design. The system may read the metadata and perform operations such as synthesis, placement, and routing in accordance with the metadata. In one aspect, for example, the metadata may describe the portions of the programmable circuitry available for use in implementing the kernel(s).

For example, the metadata may define the boundaries of the OCL region within the programmable IC. In another aspect, operations such as placement and routing may be performed using the metadata so that signals may couple input and/or output pins of the kernels with input and/or output pins of the various interface circuits of the static region. For example, the system may place particular circuit blocks of the kernels closer to the particular interface circuits of the static circuit design utilized by the circuit blocks. The system may route signals to couple input and/or output pins of kernels with input and/or output pins of the interface circuitry of the static region.

In another example, source files 620 may specify two or more OCL regions. Each OCL region may implement one or more hardware accelerators. In that case, the static circuit design may provide connectivity among two or more OCL regions. For example, source files 620 may specify two or more OCL regions that are intended to communicate with one another. In that case, the static region may include circuitry and/or wires that communicatively link the two or more OCL regions together. In this manner, the user need not be concerned with on-chip interconnects and/or communication channels necessary for the OCL regions to communicate. Instead, each OCL region may simply couple to the static region. The static region may include the circuitry that facilitates communication between the OCL regions. For example, the static region may include bus circuitry over which two or more different OCL regions implemented concurrently within the programmable IC may communicate.

As noted, the static circuit design may be fully implemented as specified by a design checkpoint and/or a configuration bitstream within DSA 605. Accordingly, in performing block 625, the system need not perform synthesis, placement, or routing on the static circuit design. Any design flow operations may be performed exclusively on the kernel(s) specified in source files 620. Because the system does not need to implement the static circuit design, the overall process of kernel implementation may be performed in significantly less time than is the case for other handoff processes where the static circuit design is provided to the user as source files not yet synthesized, placed, and/or routed.

In another aspect, the static circuit design may be partially implemented. For example, the static circuit design may have been synthesized, but not placed or routed. In another example, the static circuit design may have been synthesized and placed, but not routed. In either case, the system may perform the needed operations of the design flow on the static circuit design to complete implementation. It should be appreciated that in the case of a partially implemented static circuit design provided in a design checkpoint the system still may implement the kernel(s) and/or the static circuit design in significantly less time as at least one phase of the design flow need not be performed on the static circuit design.

In block 630, the system may generate one or more configuration bitstream(s) 635. Configuration bitstream(s) 635 may include, or specify, a hardware implementation of the kernel(s) (i.e., the hardware accelerators). In one aspect, the system may generate a configuration bitstream that includes both the implemented static region and the implemented kernels. In another aspect, the system may extract the configuration bitstream for the static region from the DSA and output that configuration bitstream and further output a partial configuration bitstream specifying one or more implemented kernels as one or more OCL regions. In still another aspect, the system may generate a configuration bitstream for the static region from a design checkpoint of DSA 605 and generate a partial configuration bitstream specifying one or more implemented kernels as one or more OCL regions. Thus, as used herein, the term "configuration bitstream" may refer to a complete (i.e., full) configuration bitstream, a configuration bitstream and one or more partial configuration bitstreams, or may refer to one or more partial configuration bitstreams.

Figure 7:
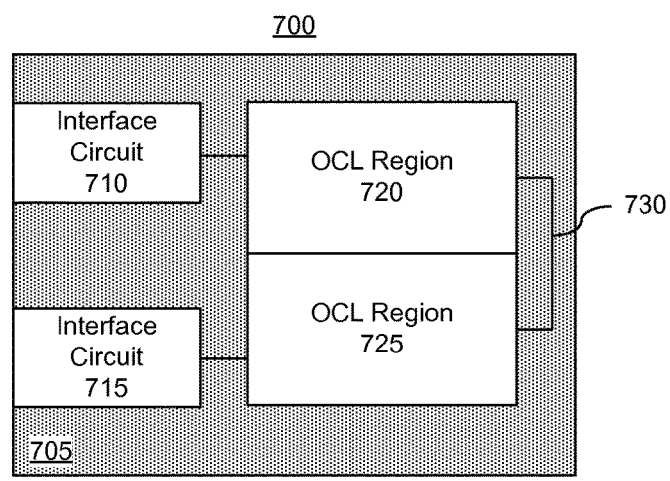
FIG. 7 is a block diagram illustrating another exemplary programmable IC.

FIG. 7 is a block diagram illustrating another exemplary programmable IC 700. Programmable IC 700 includes a static region 705 and a first OCL region 720 and a second OCL region 725. Static region 705 further includes an interface circuit 710 coupled to OCL region 720 and an interface circuit 715 coupled to OCL region 725. In one example, each of OCL regions 720 and 725 may include one or more hardware accelerators.

The example of FIG. 7 illustrates a case where static region 705 includes circuitry 730 that is configured to communicatively link OCL region 720 with OCL region 725. OCL region 720 and OCL region 725 may be communicatively linked through circuitry 730 without having to send and receive data through the host. For example, OCL regions 720 and 725 may communicate entirely within programmable IC 700. Further, OCL regions 720 and 725 may be implemented independently without need to determine the particular manner in which the two OCL regions will communicate. For example, the metadata describing the static circuit design for static region 705 may specify the type of circuitry 730 that is available so that the synthesis, placement, and routing of OCL regions 720 and 725 allows each to couple to circuitry 730. Circuitry 730 may be wires or interconnects or may be more complex circuitry such as a communication bus that allows two or more different OCL regions to communicate.

Figure 8:
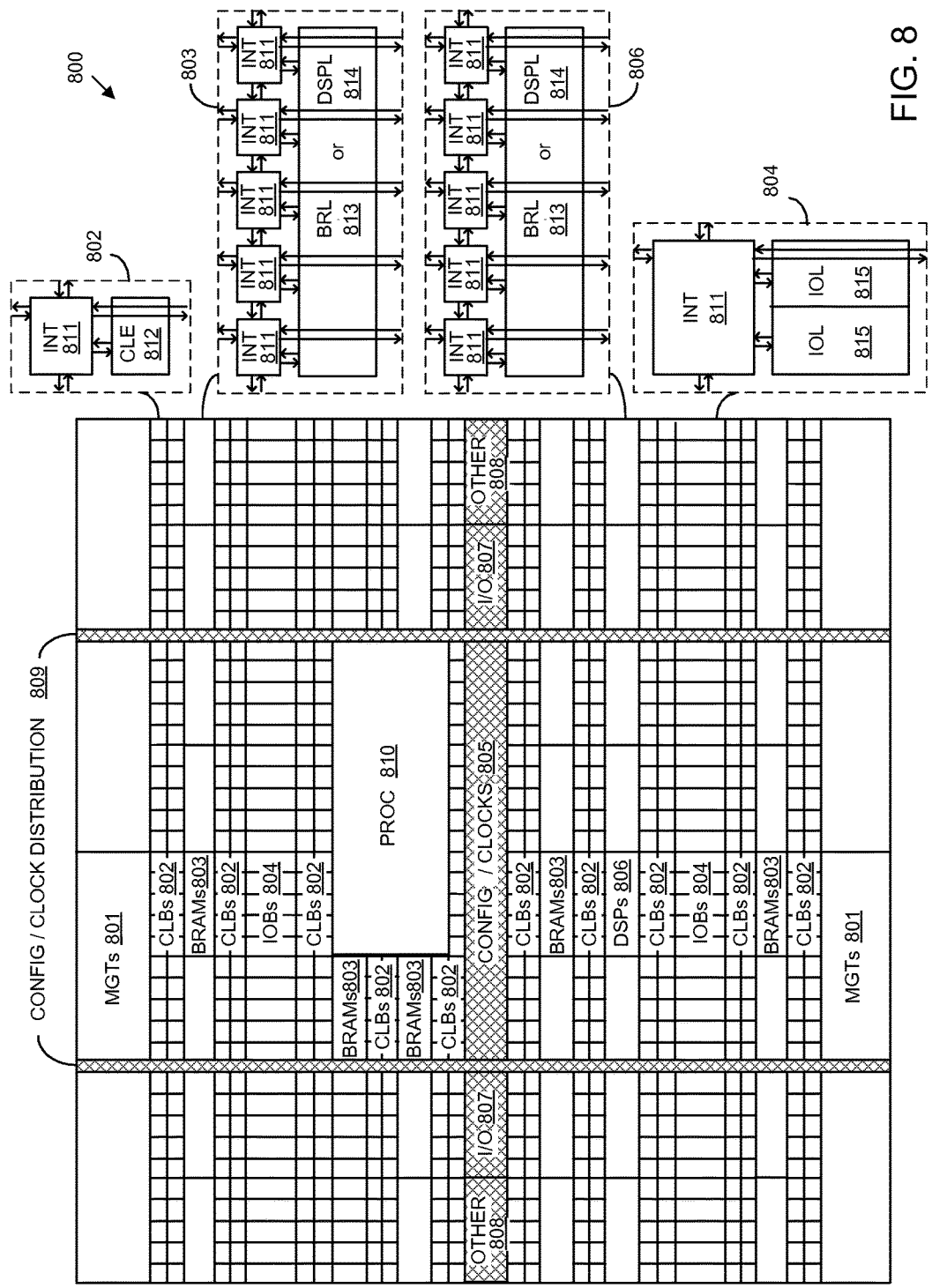
FIG. 8 is a block diagram illustrating an exemplary architecture for an IC.

FIG. 8 is a block diagram illustrating an exemplary architecture 800 for an IC. Architecture 800 may be implemented within a programmable IC of a hardware acceleration device as described herein. For example, architecture 800 may be used to implement an FPGA. Architecture 800 may also be representative of a system-on-chip (SOC) type of IC. An SOC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 800 includes several different types of programmable circuit, e.g., logic, blocks. For example, architecture 800 may include a large number of different programmable tiles including multi-gigabit transceivers (MGTs) 801, configurable logic blocks (CLBs) 802, random access memory blocks (BRAMs) 803, input/output blocks (IOBs) 804, configuration and clocking logic (CONFIG/CLOCKS) 805, digital signal processing blocks (DSPs) 806, specialized I/O blocks 807 (e.g., configuration ports and clock ports), and other programmable logic 808 such as digital clock managers, analog-to-digital converters, system monitoring logic, and so forth.

In some ICs, each programmable tile includes a programmable interconnect element (INT) 811 having standardized connections to and from a corresponding INT 811 in each adjacent tile. Therefore, INTs 811, taken together, implement the programmable interconnect structure for the illustrated IC. Each INT 811 also includes the connections to and from the programmable logic element within the same tile, as shown by the examples included at the top of FIG. 8.

For example, a CLB 802 may include a configurable logic element (CLE) 812 that may be programmed to implement user logic plus a single INT 811. A BRAM 803 may include a BRAM logic element (BRL) 813 in addition to one or more INTs 811. Typically, the number of INTs 811 included in a tile depends on the height of the tile. As pictured, a BRAM tile has the same height as five CLBs, but other numbers (e.g., four) also may be used. A DSP tile 806 may include a DSP logic element (DSPL) 814 in addition to an appropriate number of INTs 811. An 10B 804 may include, for example, two instances of an I/O logic element (IOL) 815 in addition to one instance of an INT 811. The actual I/O pads connected to IOL 815 may not be confined to the area of IOL 815.

In the example pictured in FIG. 8, a columnar area near the center of the die, e.g., formed of regions 805, 807, and 808, may be used for configuration, clock, and other control logic. Horizontal areas 809 extending from this column may be used to distribute the clocks and configuration signals across the breadth of the programmable IC.

Some ICs utilizing the architecture illustrated in FIG. 8 include additional logic blocks that disrupt the regular columnar structure making up a large part of the IC. The additional logic blocks may be programmable blocks and/or dedicated circuitry. For example, a processor block depicted as PROC 810 spans several columns of CLBs and BRAMs.

In one aspect, PROC 810 may be implemented as dedicated circuitry, e.g., as a hardwired processor, that is fabricated as part of the die that implements the programmable circuitry of the IC. PROC 810 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 810 may be omitted from architecture 800 and replaced with one or more of the other varieties of programmable blocks described. Further, such blocks may be utilized to form a "soft processor" in that the various blocks of programmable circuitry may be used to form a processor that can execute program code as is the case with PROC 810.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 8 that are external to PROC 810 such as CLBs 802 and BRAMs 803 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 810.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SOC, the configuration bitstream may specify the circuitry that is to be implemented within the programmable circuitry and the program code that is to be executed by PROC 810 or a soft processor. In some cases, architecture 800 includes a dedicated configuration processor that loads the configuration bitstream to the appropriate configuration memory and/or processor memory. The dedicated configuration processor does not execute user-specified program code. In other cases, architecture 800 may utilize PROC 810 to receive the configuration bitstream, load the configuration bitstream into appropriate configuration memory, and/or extract program code for execution.

FIG. 8 is intended to illustrate an exemplary architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 8 are purely exemplary. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 810 within the IC are for purposes of illustration only and are not intended as limitations.

In another aspect, architecture 800 may be used to implement a heterogeneous processing platform as described. Programmable circuitry of architecture 800 may be used to implement a static region and one or more OCL regions. Processor 810 may be used as the host processor and execute the host program code.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the term "another" means at least a second or more. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing.

As defined herein, the term "coupled" means connected, whether directly without any intervening elements or indirectly with one or more intervening elements, unless otherwise indicated. Two elements may be coupled mechanically, electrically, or communicatively linked through a communication channel, pathway, network, or system. As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof. As defined herein, the term "output" means storing in physical memory elements, e.g., devices, writing to display or other peripheral output device, sending or transmitting to another system, exporting, or the like. As defined herein, the term "plurality" means two or more than two.

As defined herein, the term "executable operation" is a task performed by a data processing system or a processor unless the context indicates otherwise. Examples of executable operations include, but are not limited to, "processing," "computing," "calculating," "determining," "displaying," "comparing," or the like. In this regard, operations refer to actions and/or processes of the data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

As defined herein, the term "high level programming language" means a programming language, or set of instructions, used to program a data processing system where the instructions have a strong abstraction from the details of the data processing system, e.g., machine language. For example, a high level programming language may automate or hide aspects of operation of the data processing system such as memory management. The amount of abstraction typically defines how "high level" the programming language is. Using a high level programming language frees the user from dealing with registers, memory addresses, and other low level features of the data processing system upon which the high level programming language will execute. In this regard, a high level programming language includes little or no instructions that translate directly, on a one-to-one basis, into a native opcode of a data processing system. Examples of high level programming languages include, but are not limited to, C, C++, SystemC, OpenCL, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the term "real time" means a level of processing responsiveness that a user or system senses as sufficiently immediate for a particular process or determination to be made, or that enables the processor to keep up with some external process. As defined herein, the term "user" means a human being. The terms first, second, etc. may be used herein to describe various elements. These elements should not be limited by these terms, as these terms are only used to distinguish one element from another unless stated otherwise or the context clearly indicates otherwise.

In some instances, the term "signal" may be used within this disclosure to describe physical structures such as terminals, pins, signal lines, wires. In other instances, the term "signal" may be used to refer to particular values specified by a wire. The term "signal" may refer to the conveyance of a single bit, e.g., a single wire, or the conveyance of multiple parallel bits through multiple parallel wires. Further, each signal may represent bi-directional communication between two, or more, components connected by the signal.

A computer program product may include a computer readable storage medium (or media) having computer readable program instructions thereon for causing a processor to carry out aspects of the inventive arrangements described herein. Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, state-setting data, or either source code or object code written in any combination of one or more programming languages, including an object oriented programming language and/or procedural programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A method may include performing, using a processor, a design flow on a static circuit design specifying a region reserved for a hardware accelerator and a static region including interface circuitry configured to couple the hardware accelerator with an external node. The design flow may generate an implemented static circuit design. The method may include generating, using the processor, metadata describing the interface circuitry and writing, using the processor, a device support archive comprising the implemented static circuit design and the metadata to a computer readable storage medium.

Writing the device support archive may include writing the device support archive as a single file.

Writing the device support archive may also include including a driver for the interface circuitry within the device support archive. The driver is executable by a host processor of a heterogeneous processing platform.

The method also may include generating a configuration bitstream specifying the static region. Accordingly, writing the device support archive may include including the configuration bitstream specifying the static region within the device support archive.

The region reserved for the hardware accelerator may be designated as a partially reconfigurable region of a programmable IC.

Writing the device support archive may include encrypting the device support archive.

Writing the device support archive may include including an image of at least a portion of a hardware accelerator device having a programmable IC that implements the static circuit design and the hardware accelerator.

Writing the device support archive may include including an implemented test kernel within the device support archive. The implemented test kernel, when loaded into a programmable IC, may be located in the region reserved for the hardware accelerator. In one aspect, the implemented test kernel may be specified as a partial configuration bitstream.

In another arrangement, the region reserved for the hardware accelerator may include a first OpenCL region and a second OpenCL region. The static region may include circuitry configured to couple the first OpenCL region with the second OpenCL region.

A method may include reading, using a processor, metadata from a device support archive including an implemented static circuit design. The metadata may describe interface circuitry of the implemented static circuit design. The method may include generating, using the processor, a register transfer level kernel implementation from a high level programming language kernel implementation, combining, using the processor, the circuit design of the static region with the register transfer level kernel implementation using the metadata, and generating, using the processor, a configuration bitstream including a hardware implementation of the kernel.

In one aspect, the configuration bitstream may be a partial configuration bitstream. In another aspect, the configuration bitstream may be a full configuration bitstream including a hardware implementation of the static region.

Combining the circuit design of the static region with the register transfer level kernel implementation may include synthesizing, placing, and routing the register transfer level kernel implementation to couple to the interface circuitry specified by the metadata.

The implemented static circuit design may be synthesized, placed, and routed.

A system may include a processor programmed to initiate executable operations. The executable operations may include reading metadata from a device support archive including an implemented static circuit design. The metadata may specify interface circuitry of the implemented static circuit design. The executable operations may include generating a register transfer level kernel implementation from a high level programming language kernel implementation, combining the circuit design of the static region with the register transfer level kernel implementation using the metadata, and generating a configuration bitstream including a hardware implementation of the kernel.

In one aspect, the configuration bitstream may be a partial configuration bitstream. In another aspect, the configuration bitstream may be a full configuration bitstream including a hardware implementation of the static region.

Combining the circuit design of the static region with the register transfer level kernel implementation may include synthesizing, placing, and routing the register transfer level kernel implementation to couple to the interface circuitry specified by the metadata.

The implemented static circuit design may be synthesized, placed, and routed.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the features disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
   performing, using a processor, a design flow on a static circuit design for an integrated circuit specifying a region reserved for a hardware accelerator and a static region comprising interface circuitry configured to couple the hardware accelerator with an external node;
   wherein the design flow generates an implemented static circuit design specifying placement and routing information that leaves a space on the integrated circuit corresponding to the region for implementing a user design as the hardware accelerator;
   generating, using the processor, metadata describing the interface circuitry of the static region determined from the design flow, wherein the metadata is used to couple the user design with the interface circuitry of the implemented static circuit design; and
   writing, using the processor, a device support archive as a file comprising the implemented static circuit design and the metadata to a computer readable storage medium;
   wherein the implemented static circuit design is configured for implementation within an integrated circuit.

2. The method of claim 1, wherein the writing the device support archive comprises:
   writing the device support archive as a single file.

3. The method of claim 1, wherein the writing the device support archive comprises:
   including a driver for the interface circuitry within the device support archive;
   wherein the driver is executable by a host processor of a heterogeneous processing platform.

4. The method of claim 1, further comprising:
   generating a configuration bitstream specifying the static region;
   wherein the writing the device support archive comprises including the configuration bitstream specifying the static region within the device support archive.

5. The method of claim 1, wherein the region reserved for the hardware accelerator is designated as a partially reconfigurable region of a programmable integrated circuit.

6. The method of claim 1, wherein:
   the region reserved for the hardware accelerator is specified within the circuit design as an empty hierarchical intellectual property block data structure.

7. The method of claim 1, wherein the writing the device support archive comprises:
   including an image of at least a portion of a hardware accelerator device comprising a programmable integrated circuit that implements the static circuit design and the hardware accelerator.

8. The method of claim 1, wherein the writing the device support archive comprises:
   including an implemented test kernel within the device support archive;
   wherein the implemented test kernel, when loaded into a programmable integrated circuit, is located in the region reserved for the hardware accelerator.

9. The method of claim 8, wherein the implemented test kernel is specified as a partial configuration bitstream.

10. The method of claim 1, wherein:
    the region reserved for the hardware accelerator comprises a first OpenCL region and a second OpenCL region;
    wherein the static region comprises circuitry configured to couple the first OpenCL region with the second OpenCL region.

11. A method, comprising:
    reading, using a processor, metadata from a device support archive, wherein the device support archive is a file including the metadata and an implemented static circuit design specifying placement and routing information;
    wherein the metadata describes interface circuitry of the implemented static circuit design;
    generating, using the processor, a register transfer level kernel implementation from a high level programming language kernel implementation;
    implementing, using the processor, the register transfer level kernel implementation to couple to the interface circuitry of the implemented static circuit design based on the metadata; and
    generating, using the processor, a configuration bitstream specifying a hardware implementation of the kernel as a hardware accelerator;
    wherein the configuration bitstream is configured for implementation within an integrated circuit.

12. The method of claim 11, wherein the configuration bitstream is a partial configuration bitstream.

13. The method of claim 11, wherein the configuration bitstream is a full configuration bitstream comprising a hardware implementation of the static region.

14. The method of claim 11, wherein the implementing the register transfer level kernel implementation comprises:
    synthesizing, placing, and routing the register transfer level kernel implementation to couple to the interface circuitry specified by the metadata.

15. The method of claim 11, wherein the implemented static circuit design is synthesized, placed, and routed.

16. A system, comprising:
    a processor programmed to initiate executable operations comprising:
    reading metadata from a device support archive, wherein the device support archive is a file including the metadata and an implemented static circuit design specifying placement and routing information;

wherein the metadata specifies interface circuitry of the implemented static circuit design;

generating a register transfer level kernel implementation from a high level programming language kernel implementation;

implementing the register transfer level kernel implementation to couple to the interface circuitry of the implemented static circuit design based on the metadata; and generating a configuration bitstream specifying a hardware implementation of the kernel as a hardware accelerator;

wherein the configuration bitstream is configured for implementation within an integrated circuit.

17. The system of claim 16, wherein the configuration bitstream is a partial configuration bitstream.

18. The system of claim 16, wherein the configuration bitstream is a full configuration bitstream comprising a hardware implementation of the static region.

19. The system of claim 16, wherein the implementing the register transfer level kernel implementation comprises:

synthesizing, placing, and routing the register transfer level kernel implementation to couple to the interface circuitry specified by the metadata.

20. The system of claim 16, wherein the implemented static circuit design is synthesized, placed, and routed.

* * * * *